(12) United States Patent
Tanaka et al.

(10) Patent No.: US 7,418,018 B2
(45) Date of Patent: Aug. 26, 2008

(54) DRIVER CIRCUIT FOR SEMICONDUCTOR LASER DIODE

(75) Inventors: Keiji Tanaka, Kanagawa (JP); Katsumi Uesaka, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/508,284

(22) Filed: Aug. 23, 2006

(65) Prior Publication Data
US 2007/0047602 A1    Mar. 1, 2007

(30) Foreign Application Priority Data
Aug. 24, 2005  (JP)  ............................. 2005-243131
Oct. 4, 2005   (JP)  ............................. 2005-291458

(51) Int. Cl.
H01S 3/13    (2006.01)
H01S 3/00    (2006.01)

(52) U.S. Cl. ............... 372/38.02; 372/29.02; 372/38.07

(58) Field of Classification Search ................ 372/38.1, 372/38.07, 26, 29.02, 29.021, 38.01, 38.02, 372/38.04

See application file for complete search history.

(56) References Cited

U.S. PATENT DOCUMENTS

| 4,817,208 A | * | 3/1989 | Koch et al. ................... 398/202 |
| 2005/0025201 A1 | * | 2/2005 | Schrodinger et al. ...... 372/38.02 |
| 2006/0007971 A1 | * | 1/2006 | Sato et al. ................. 372/38.02 |
| 2006/0022861 A1 | * | 2/2006 | Kudoh et al. ................. 341/155 |

FOREIGN PATENT DOCUMENTS

JP    04-139779    5/1992

* cited by examiner

Primary Examiner—Armando Rodriguez
(74) Attorney, Agent, or Firm—Venable LLP; Michael A. Sartori; Kyle D. Petaja

(57) ABSTRACT

The present invention provides an LD driver able to stably control the output power and the extinction ratio of the optical signal without regarding the coupling mode, the AC mode or the DC mode, between the laser diode and the LD driver. The LD driver includes the peak hold and the bottom hold, each detecting the peak level or the bottom level of the monitored signal, respectively. The bias driver adjusts the bias current so as to equalize the peak level of the monitored signal to the reference, REF_PEAK, while, the modulation driver adjusts the modulation current so as to equalize the bottom level of the monitored signal to the reference, REF_BOTTOM. In the present invention, the adjustment of the modulation current by the modulation driver starts with a substantial delay with respect to the stabilization of the bias current by the bias driver.

14 Claims, 13 Drawing Sheets

DRIVER CIRCUIT FOR SEMICONDUCTOR LASER DIODE

BACKGROUND OF THE INVENTION

1. Field of the Invention

The present invention relates to a driving circuit for a semiconductor laser diode and an optical transmitter using the driver circuit.

2. Related Prior Art

A driver circuit for the semiconductor laser diode (hereinafter denoted as LD) has been well known, in which a current supplied to the LD is controlled so as to stabilize the output power and the extinction ratio based on the photocurrent generated by the monitoring photodiode (herein after denoted as PD). For instance, a Japanese patent published as H04-139779A has disclosed an LD driver with the AC-coupled configuration, in which the driver controls the bias current supplied to the LD based on the average photocurrent and controls the modulation degree based on the average and the peak value of the photocurrent.

The emission characteristic of the LD and the optical coupling efficiency with the monitoring PD are different from individual LDs. Accordingly, the LD driver is preferable to vary the conversion efficiency of the photocurrent into a corresponding voltage signal depending on the emission characteristic and the coupling efficiency with the PD.

However, a trans-impedance-amplifier (hereinafter denoted as TIA), which is widely used for the current-to-voltage converter, inherently forms a low-pass-filter (LPF) by the resistance of the trans-impedance and a junction capacitance of the PD. Accordingly, to vary the trans-impedance to change the current-to-voltage conversion efficiency results in the degradation of the high cutoff frequency of the TIA, which causes an error in the detection of the peak and bottom values of the output from the TIA.

Therefore, the present invention is to provide an LD driver that may vary the conversion ratio from the current to the voltage with reduced variation in the monitoring efficiency caused by the change of the conversion ratio.

SUMMARY OF THE INVENTION

One aspect of the invention relates to a circuit for driving a semiconductor laser diode by supplying a bias current and a modulation current thereto. The circuit includes first and second current-to-voltage converters, a reference generator, first and second error amplifiers, a bias driver and a modulation driver. The first current-to-voltage converter converts a photocurrent, which is generated by a photodiode by monitoring emission of the laser diode, into a monitored signal. The reference generator generates a reference current by superposing a reference bias current on a reference modulation current that is modulated by an external signal. The second current-to-voltage converter converts the reference current into a reference signal.

The first error amplifier is configured to compare a first level of the monitored signal with a first level of a reference signal and to output a first error signal to the bias driver so as to equalize the first level of the monitored signal and the first level of the reference signal. The bias driver outputs the bias current to the laser diode. While, the second error amplifier is configured to compare a second level of the monitored signal with a second level of the reference signal and to output a second error signal to the modulation driver so as to equalize the second level of the monitored signal and the second level of the reference signal. The modulation driver outputs the modulation current to the laser diode.

In the present invention, the reference signal is based on predetermined current signals, the reference bias current and the reference modulation current, besides the modulation current is modulated by the external signal which is the same with that to be transmitted as the optical signal. Therefore, the reference signal may trace the data in the time base and only the magnitude of the reference signal, namely, the peak level, the bottom level, the average, or the amplitude, may be controlled, which may precisely control the optical output from the laser diode.

Another aspect of the invention relates to a method for controlling the laser diode. The method include steps of: (a) creating a monitored signal by detecting an emission of the laser diode, (b) determining first and second levels of the monitored signal, (c) controlling the bias current by comparing the first level of the monitored signal with a first reference level so as to minimize a difference between the first level and the first reference level, and (d) controlling the modulation current by comparing a second level of the monitored signal with a second reference level so as to minimize a difference between a second level and a second reference level. The method has a feature that the step (d) of controlling the modulation current starts with a predetermined delay after the bias current becomes stable processed by the step (c) of controlling the bias current.

Since the controls of the bias current and the modulation current are independent and the latter control starts with the predetermined delay after the stabilization of the former control of the bias current, the controlling of the modulation current does not affect the stabilization of the bias current, and the convergence for the stabilization of both currents may be accelerated even the laser diode is coupled with the driver is the coupling capacitor.

Still another aspect of the present invention relates to a method for driving the laser diode. The method includes steps of; (a) creating a reference signal based on a reference bias current and a reference modulation current that is modulated by the external signal, (b) creating a monitored signal based on emission of the laser diode, (c) controlling the bias current by comparing a first level of the monitored signal with a first level of the reference signal so as to minimize a difference of two first levels, and (d) controlling the modulation current by comparing a second level of the monitored signal with a second level of the reference signal so as to minimize a difference of two second levels.

In the present invention, the reference signal is based on predetermined currents, the reference bias current and the reference modulation current, besides the modulation current is modulated by the external signal which is the same with that to be transmitted as the optical signal. Therefore, the reference signal may trace the data in the time base and only the magnitude of the reference signal, namely, the peak level, the bottom level, the average, or the amplitude, may be controlled, which may precisely control the optical output from the laser diode.

Figure 10:
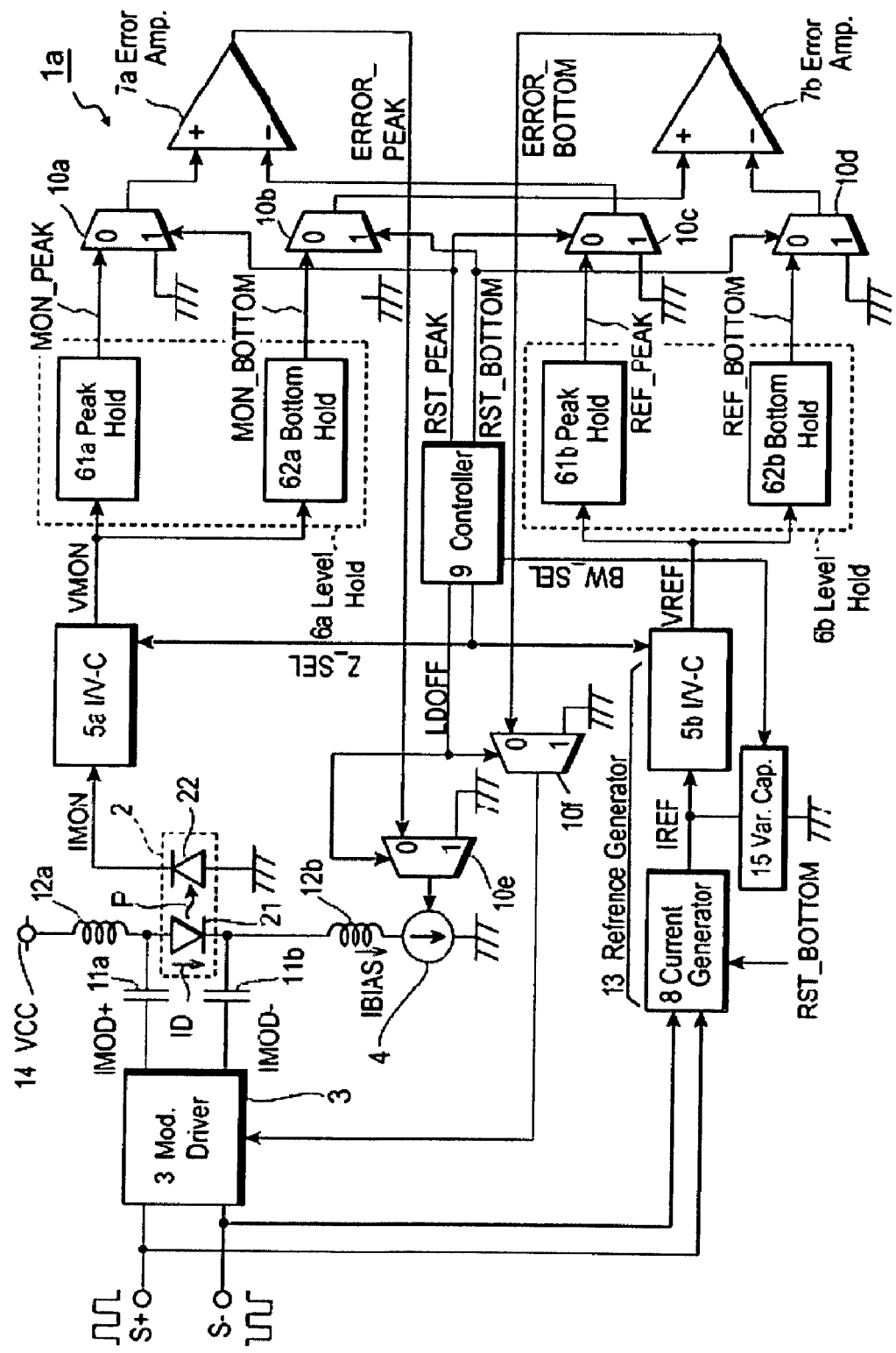
Figure 11:
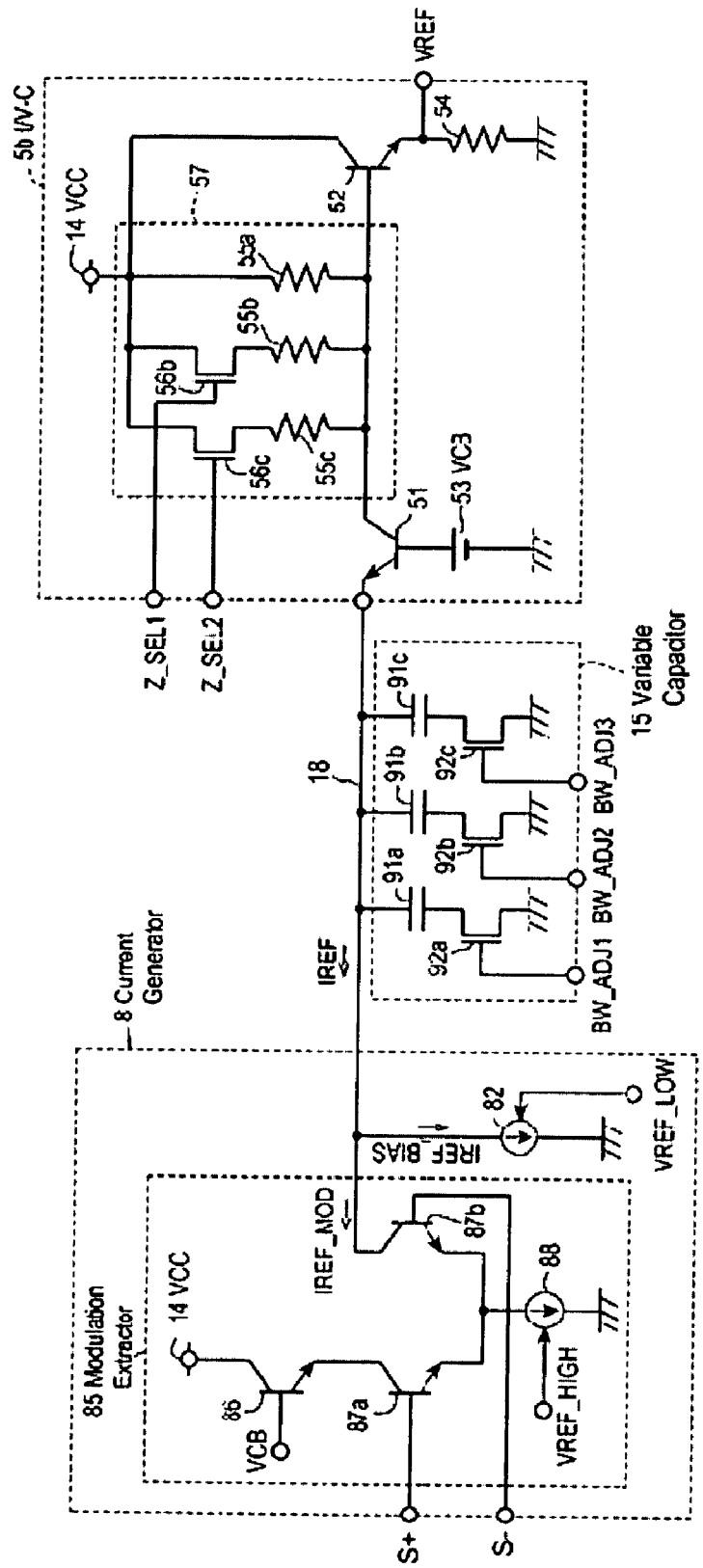
Figure 12:
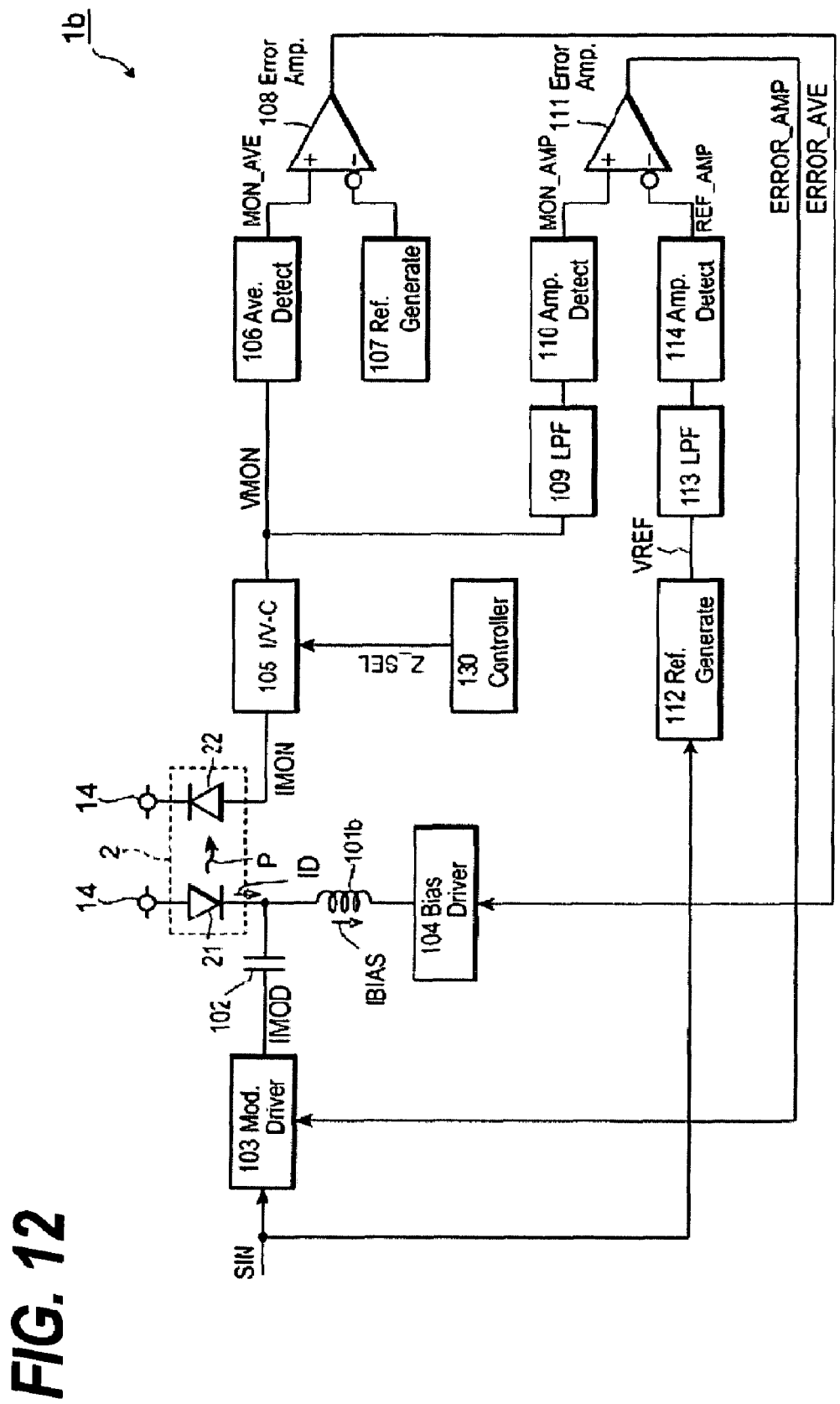
Figure 13:
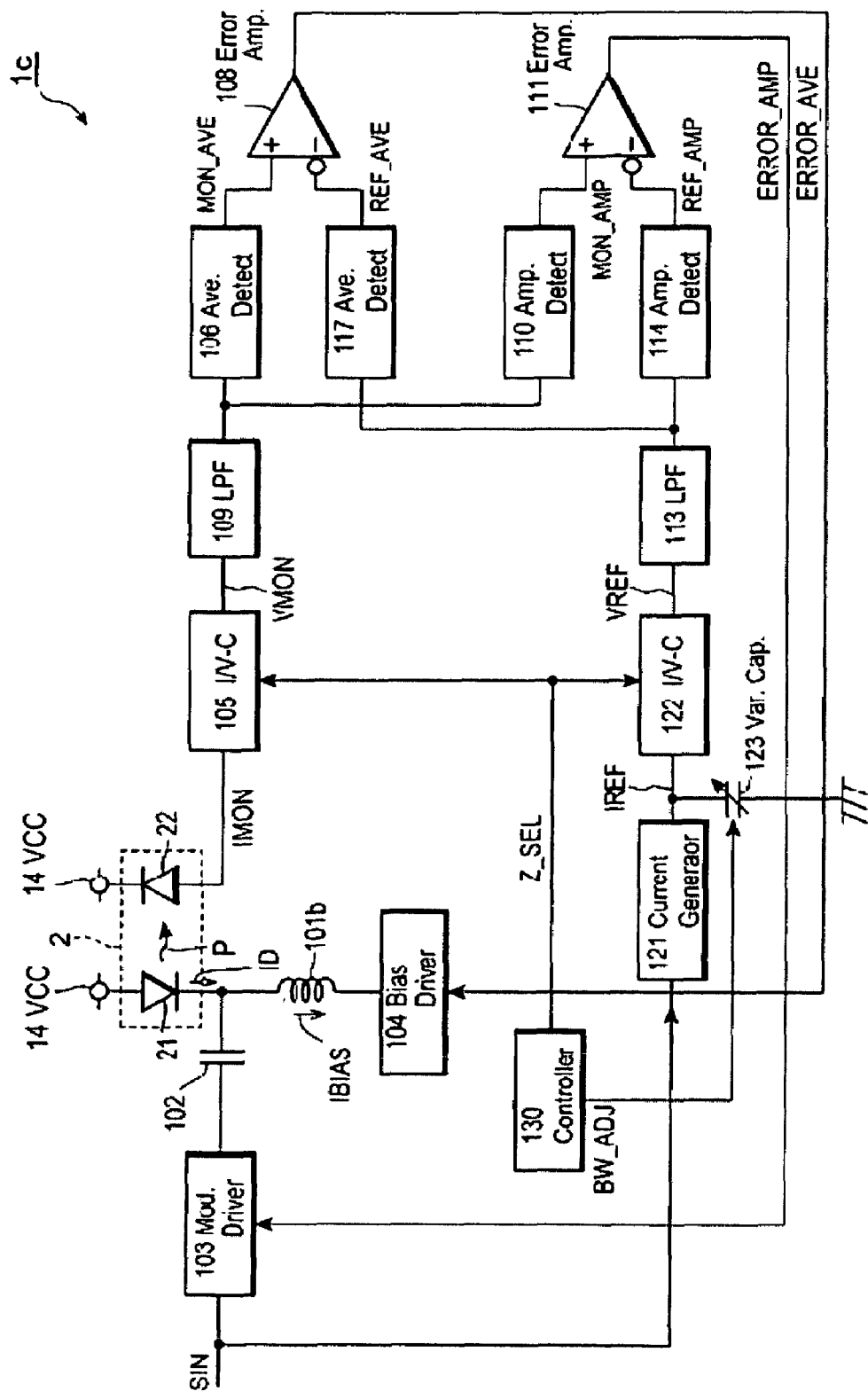

FIGS. from 7A to 7E show time charts of the references, VREF_LOW, VREF_HIGH, VREF, REF_PEAK, and REF_BOTTOM, respectively;

FIGS. from 8A to 8D show time charts of the control signals, LDOFF, RST_PEAK, RST_BOTTOM, and Z_SEL;

FIGS. from 9A to 9D show time chars of the monitored signals, VMON, MON_PEAK, and MON_BOTTOM, and the driving current ID;

FIG. 10 is a block diagram of the LD driver according to the second embodiment of the invention;

FIG. 11 shows an example of the variable capacitor;

FIG. 12 is a block diagram of the LD driver according to the third embodiment of the invention; and FIG. 13 is a block diagram of the LD driver according to the fourth embodiment of the present invention.

DESCRIPTION OF PREFERRED EMBODIMENTS

Next, preferred embodiments of the LD driver and the optical transmitter according to the present invention will be described as referring to accompanying drawings. In the explanation of drawings, the same symbols or numerals will refer to the same elements without overlapping explanations.

First Embodiment

Figure 1:
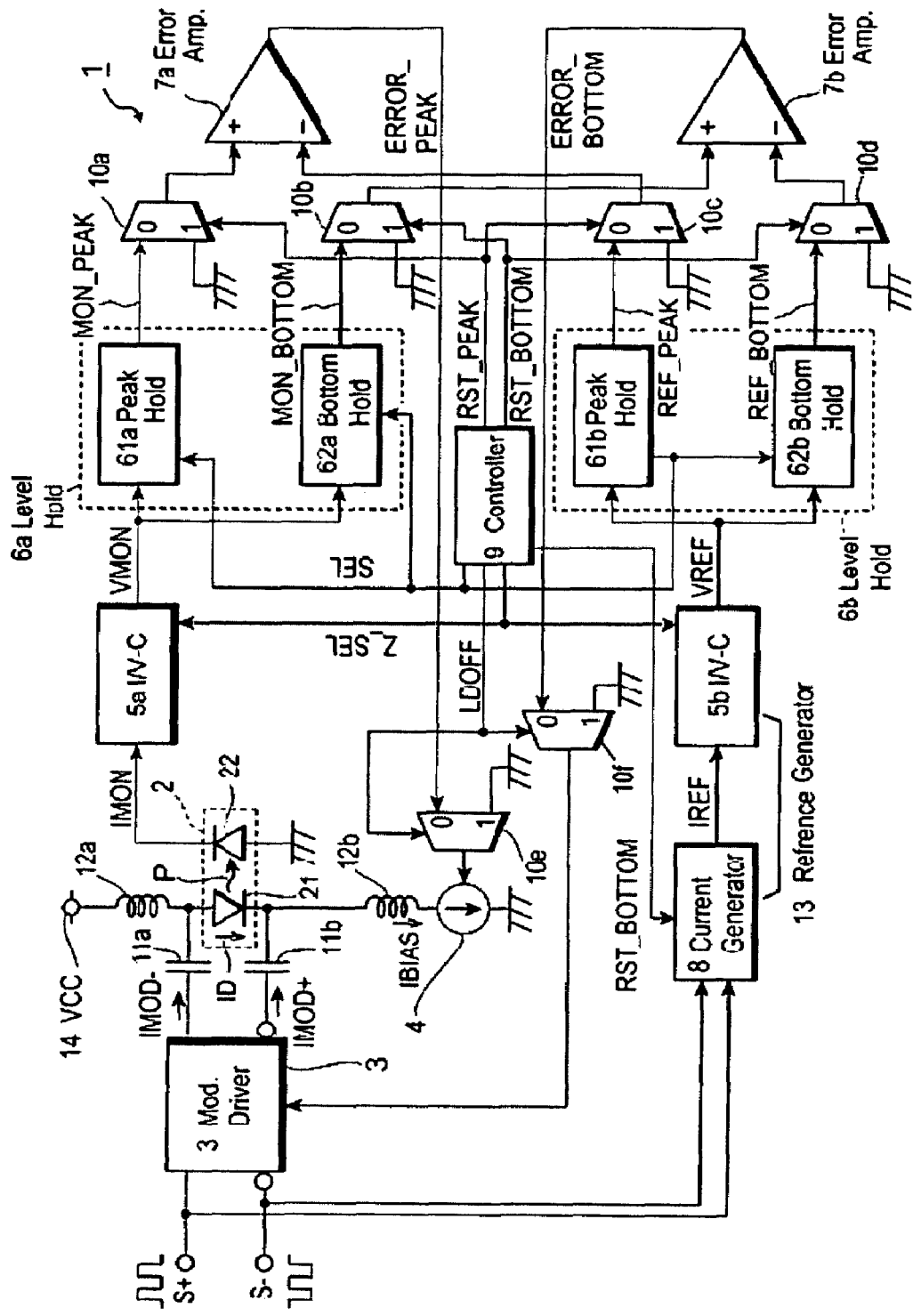
FIG. 1 is a block diagram of the LD driver according to the first embodiment of the invention.
Figure 2A:
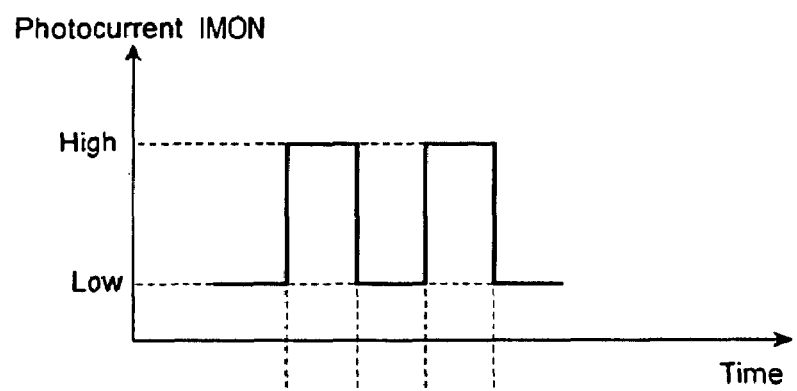
FIG. 2A is a time chart of the photocurrent IMON output from the PD.
Figure 2B:
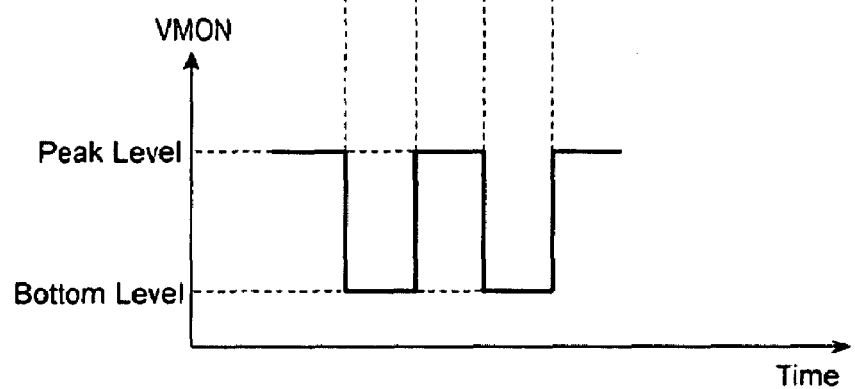
FIG. 2B is a time chart of the voltage signal VMON converted from the photocurrent.

FIG. 1 is a block diagram of an LD driver 1 according to the first embodiment of the present invention. The LD driver 1 shown in FIG. 1 drives an optical module 2 that includes the LD 21 for generating an optical signal P and the PD 22 for monitoring the optical signal P. The LD 21 emits the optical signal P by providing a driving current ID from the LD driver 1. The driving current ID includes modulation currents, IMOD+ and IMOD−, which is modulated by the signals, S+ and S−, complementary to each other and externally supplied, and a bias current IBIAS that is substantially a DC current.

The I-L characteristic, the characteristic of the optical output against the driving current, strongly depends on temperatures. That is, the threshold current of the LD becomes large when the temperature of the LD is raised, which means that a larger driving current is necessary to obtain a predetermined magnitude in the optical output. Therefore, to keep the extinction ratio, which is the ratio of the peak value PH of the optical output from the LD to the bottom value PL thereof, is necessary to adjust the bias current IBIAS and the modulation current IMOD depending on the temperature. The LD driver 1 adjusts the peak value PH and the extinction ratio (PH/PL) based on the photocurrent IMON generated by the PD 22.

The LD driver 1 of the present embodiment has, what is called, the AC-coupled configuration, and includes a modulation driver 3, a bias driver 4, current-to-voltage converters (hereinafter denoted as I/V-C), 5a and 5b, two level holds, 6a and 6b, two error amplifiers, 7a and 7b, a plurality of switches, 10a to 10f, and a controller 9.

The modulation driver 3 generates the modulation currents, IMOD+ and IMOD−, complementary to each other and each modulated with the driving signals, S+ and S−. The non-inverting output of the modulation driver 3 is coupled with the anode of the LD 21 via a capacitor 11a, while, the inverting output thereof is coupled with the cathode of the LD 21 via the other capacitor 11b. Moreover, the modulation driver 3 has an input to receive the signal ERROR_BOTTOM from the error amplifier 7b, and adjusts the modulation currents, IMON+ and IMON−, so as to equalize two inputs of the error amplifier 7b.

The bias driver 4 generates the bias current IBIAS. One end of the bias driver 4 is coupled with the cathode of the LD 21 via an inductor 12b, while, the anode of the LD 21 is connected to the power supply VCC 14 via the other inductor 12a. Moreover, the bias driver 4 has an input to receive the signal ERROR_PEAK from the other error amplifier 7a. The bias driver 4 adjusts the bias current IBIAS so as to equalize two inputs of the error amplifier 7a. Although the bias driver 4 is coupled with the cathode of the LD 21 in the present embodiment, the bias driver 4 may be coupled with the anode of the LD 21, that is, the bias driver 4 may be connected between the LD 21 and the power supply 14.

The first I/V-C 5a converts the photocurrent IMON generated by the PD 22 into a corresponding voltage signal VMON. FIGS. from 2A and 2B show time charts to convert the current IMON to the voltage signal VMON. The I/V-C 5a outputs the peak level in the voltage signal VMON when the current IMON is low, while, the I/V-C 5a outputs the bottom level when the current IMON is high. Thus, the phase of the voltage signal VMON is reversed to the current IMON.

The level hold 6a includes a peak hold 61a and a bottom hold 62a. The peak hold 61a traces the peak level of the output VMON of the I/V-C 5a and sends the traced peak level MON_PEAK to the error amplifier 7a via the switch 10a. The bottom hold 62a traces the bottom level of the output VMON and sends the traced bottom level MON_BOTTOM to the error amplifier 7b via the switch 10b. Here, as previously explained, the peak level MON_PEAK is derived from the low level of the optical signal P, while, the bottom level MON_BOTTOM corresponds to the high level of the optical signal P.

The first error amplifier 7a detects the difference between the output MON_PEAK of the peak hold 61a and the output REF_PEAK of the peak hold 61b, and sends the output ERROR_PEAK to the bias driver 4. Specifically, the non-inverting input of the error amplifier 7a receives the output MON_PEAK of the peak hold 61a, while, the inverting input of the amplifier 7a receives the output REF_PEAK of the peak hold 61b. The output ERROR_PEAK of the amplifier 7a couples with the bias driver 4 via the switch 10e.

The second error amplifier 7b detects the difference between the output MON_BOTTOM of the bottom hold 62a and the output REF_BOTTOM of the bottom hold 62b, and sends the output ERROR_BOTTOM to the modulation driver 3. Specifically, the non-inverting input of the amplifier 7a couples with the output of the bottom hold 62a, while, the inverting input thereof couples with the bottom hold 62b, and the output thereof couples with the modulation driver 3 via the switch 10f.

The reference generator 13 constitutes the current generator 8 and the second I/V-C 5b to generate a reference signal VREF modulated by the external signals, S+ and S−. That is, as explained later, the reference generator 8 is configured to modulate a predetermined current with the external signals, S+ and S−, and to superpose a second predetermined current on the first predetermined current to generate the reference current IREF. That is, the reference current IREF simulates the target driving current of the LD 21.

The second I/V-C 5b converts this reference current IREF into the reference signal VREF. The I/V-C 5b may have the same configuration with that of the first I/V-C 5a. That is, the I/V-C 5b includes a transistor operated in the common base configuration with a variable load resistance that may be controlled by signals, Z_SEL1 and Z_SEL2, which will be explained later. The second I/V-C 5*b* outputs the peak level responding to the LOW level of the reference current IREF, while outputs the bottom level responding to the HIGH level of the current IREF, that is, the voltage signal VREF has a phase opposite to that of the reference current IREF.

The second level hold 6*b* includes the second peak hold 61*b* and the second bottom hold 62*b*. The second peak hold traces the peak level of the reference signal VREF to generate the output REF_PEAK that is to be sent to the first error amplifier 7*a* via the switch 10*c*. The second bottom hold 62*b* traces the bottom level of the reference signal VREF to generate the output REF_BOTTOM that is to be sent to the second error amplifier 7*b* via the switch 10*d*.

The controller 9 controls respective switches, 10*a* to 10*f*. The controller 9 sends the signal RST_PEAK to the switches, 10*a* and 10*c*, and sends the signal RST_BOTTOM to the switches, 10*b* and 10*d*. Further, the controller 9 sends the signal LDOFF to the switches, 10*e* and 10*f*. In respective switches, 10*a* to 10*f*, the input and the output thereof are short circuited when the control signal provided therein is in the LOW level, while the output thereof is isolated from the input and grounded when the control signal provided therein is in the HIGH level.

Figure 3:
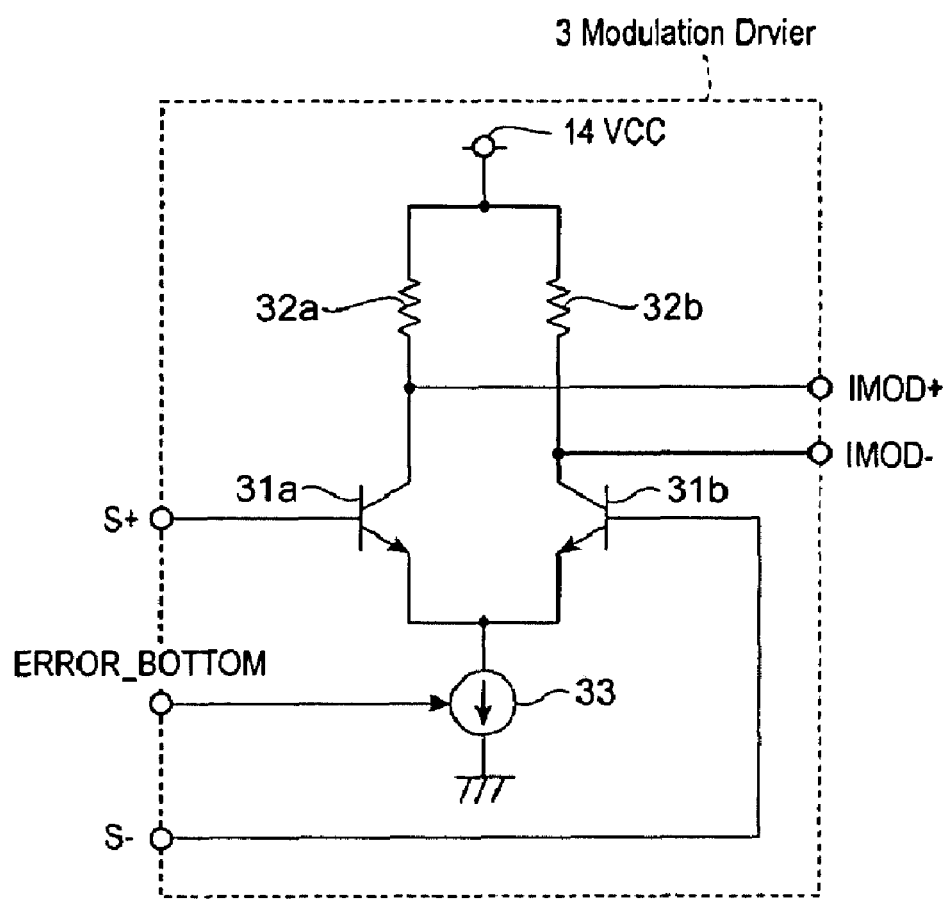
FIG. 3 shows an example of the modulation driver.

FIG. 3 is a circuit diagram of the modulation driver 3 according to the present embodiment. The modulation driver 3 in FIG. 3 configures a standard differential circuit including a pair of transistors, 31*a* and 31*b*, a pair of load resistors, 32*a* and 32*b*, and a current source 33 that receives the signal ERROR_BOTTOM from the second error amplifier 7*b*. The modulation current IMOD is so controlled that the two signals, MON_BOTTOM and REF_BOTTOM, both input to the second error amplifier are substantially equal to each other.

Figure 4:
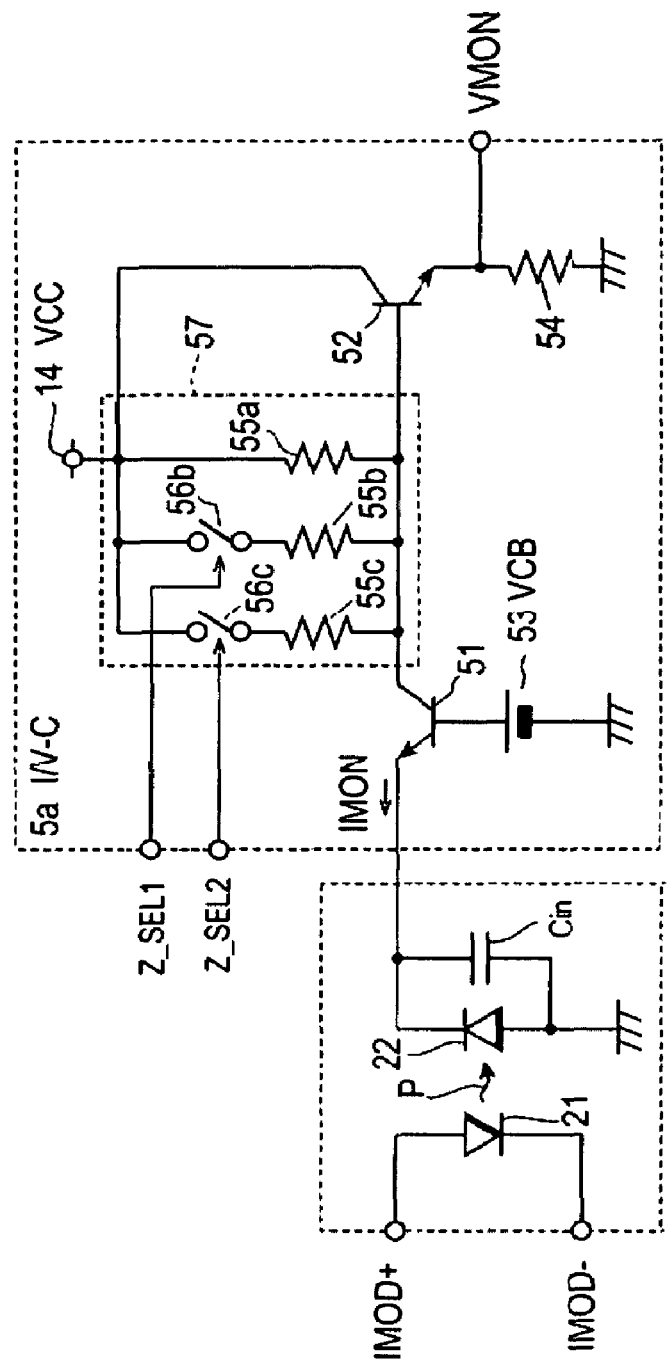
FIG. 4 shows an example of the current-to-voltage converter that includes a transistor with the common base configuration.

FIG. 4 is a circuit diagram of the I/V-C 5*a* that includes two transistors, 51 and 52 and a variable resistor 57. The transistor 51 and the variable resistor 57 configure, what is called, the common base circuit. That is, the collector of the transistor 51 is connected to the power supply VCC 14 via the variable resistor 57, the emitter thereof is coupled with the cathode of the PD 22 to input the current IMON and the base is applied with the bias voltage VCB. According to the circuit shown in FIG. 4, a current proportional to the photocurrent IMON generated in the PD 22 appears in the collector of the transistor 51. Thus, the level of the collector may be determined by the current flowing in the collector and the resistance of the variable resistor 57. The conversion ratio from the photocurrent IMON to the level of the collector VMON depends on the resistance of the variable resistor 57.

The variable resistor 57 includes a plurality of resistors, 55*a* to 55*c*, with fixed resistance and connected in parallel to each other and switches, 56*b* and 56*c*. These switches, 56*b* and 56*c*, are connected in serial to each resistor, 55*b* or 55*c*. The switches, 56*b* and 56*c*, each receives the control signals, Z_SEL1 or Z_SEL2, from the controller 9 that turning on or turning off. Depending on the combination of the switches that turn on by the control signals, the resistance of the variable resistor 57 may be changed. Another transistor 52 and the resistor 54 form the emitter follower circuit. The switches, 56*b* and 56*c*, may be a transistor switch, in particular, a MOS transistor may be applicable for the switches shown in FIG. 4. That is, because the common base circuit has a characteristic of the small input impedance and the large output impedance, the emitter follower circuit lowers the output impedance of the I/V-C 5*a*.

A conventional current-to-voltage converter with a trans-impedance amplifier provides a feed back resistor between the input and the output thereof. The voltage output of the TIA may be determined by the current generated in the PD 22 to flow in the feedback resistor to cause a voltage drop thereat. The conversion gain of the I/V-C with the TIA type is determined by the resistance of the feedback resistor.

On the other hand, the present I/V-C shown in FIG. 4 provides the input transistor with the common base configuration with the input impedance $Zin=1/gm$ and the trans-impedance $ZT=R57$. The cut-off frequency due to the input impedance Zin and the capacitance $C_{IN}$ attributed to the PD 22 becomes $fc=1/2/\Pi/Cin/gm$, where gm is the trans-conductance of the transistor 51 with the common base configuration.

Thus, the input impedance Zin of the I/V-C 5*a* of the present embodiment depends only on the trans-conductance gm of the transistor 51 and the cut-off frequency fc depends on the capacitance Cin attributed to the PD 22 and the trans-conductance gm. Moreover, the conversion gain ZT depends only on the resistance of the resistor 57. Therefore, to vary the resistance of the resistor 57 to change the conversion gain does not affect the frequency response of the I/V-C 5*a*, namely, the cut-off frequency fc thereof. Oppositely, to vary the capacitance $C_{IN}$ to change the cut-off frequency fc does not affect the conversion gain ZT.

On the other hand, the conventional I/V-C with the TIA has the characteristics of the input impedance $Zin=RTIA/(1+Ao)$ and the conversion gain $Z_T=RTIA \times Ao/(1+Ao)$, where RTIA is the trans-impedance and Ao is the open loop gain of the TIA. The cut-off frequency becomes $fc=1/2/\Pi/ZT/C_{IN}$.

Thus, the input impedance Zin is affected by the open loop gain Ao and the conversion gain ZT is affected by both of the resistance of the feedback resistor RTIA and the open loop gain Ao. Accordingly, because the cut-off frequency fc depends on both of the capacitance $C_{IN}$ and the trans-impedance ZT, the cut-off frequency fc is changed when the trans-impedance RTIA is changed to adjust the conversion gain ZT.

The LD driver 1 of the present embodiment includes the I/V-C 5*a* with the common base configuration. Moreover, the variable collector resistor enables to change the conversion gain without changing the frequency response of the I/V-C 5*a*. Accordingly, it is unnecessary to adjust the frequency response of the I/V-C 5*a* that is necessary to fit the conversion gain thereof to individual LDs.

Moreover, this I/V-C 5*a* restricts the frequency bandwidth of the monitored signal VMON output by changing the trans-conductance gm of the transistor 51, which reduces the crosstalk nose contained in the monitored current IMON. The cross talk noise generally occurs at the leading or falling edges of the modulation current. Because the I/V-C 5*a* reduces this crosstalk noise, the level hold 6*a* or 6*b* may accurately detects the peak and bottom levels of the monitored signal VMON.

Figure 5:
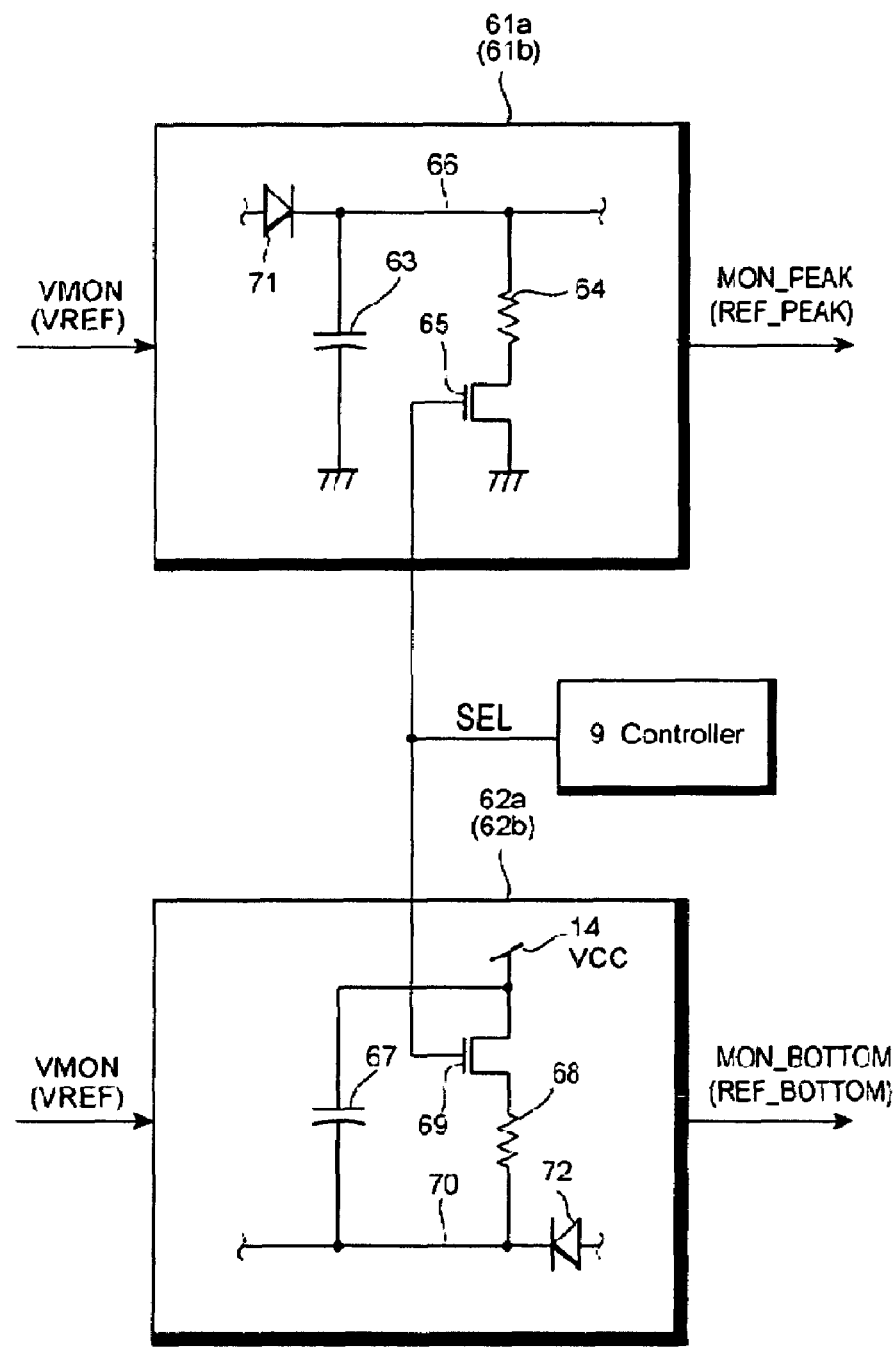
FIG. 5 shows an example of the peak detector and the bottom detector.

FIG. 5 is circuit diagrams of the peak hold, 61*a* or 61*b*, and the bottom hold, 62*a* or 62*b*. The peak hold, 61*a* or 61*b*, includes a diode 71 that rectifies the signal, VMON or VREF, and a capacitor 63 to hold the peak level of the rectified signal. The peak hold, 61*a* or 61*b*, may trace the peak level by storing charges within the capacitor 63 and output thus traced peak level to the first error amplifier as the signal, MON_PEAK or REF_PEAK.

The peak hold, 61*a* or 61*b*, further provides a series circuit of a resistor 64 and a transistor 65 between the signal line and the ground. This resistor 64 and the transistor 65 adjust the time constant of the peak hold, 61*a* or 61*b*. That is, the gate of the transistor 65 receives the control signal SEL from the controller 9. Turning on the transistor 65 by the signal SEL, the charges accumulated within the capacitor 63 may be discharged to the ground via the resistor 64, which shortens the time constant for the discharge of the capacitor 63. Oppositely, when the transistor 65 is turned off by the control signal SEL, the time constant for discharging the capacitor 63 is prolonged. Thus, by changing the turn-on and turn-off of the transistor by the control signal SEL, the time constant to discharge the capacitor 63, which corresponds to the time constant of the peak holds, 61a and 61b.

The bottom hold, 62a or 62b, also includes a capacitor 67, a diode for rectifying, and a series circuit of a resistor 68 and a transistor 69. The capacitor 67, different from the peak holds, 61a and 61b, is connected between the signal line 70 and the power supply VCC 14. The bottom level of the signal line 70 is to be traced by charging the capacitor 67 to output the signal, MON_BOTTOM or REF_BOTTOM, to the second error amplifier 7b.

The bottom holds, 62a and 62b, further provide, similar to the peak holds, 61a and 61b, a circuit comprising a resistor 68 and a transistor 69 connected in series to each other to adjust the time constant of the bottom holds, 62a and 62b, between the power supply VCC and the signal line 70. The base of the transistor 69 receives the control signal SEL to switch the transistor 69. Turning on the transistor 69 by the control signal SEL, the charges accumulated in the capacitor 67 may discharge through the resistor 68. While, turning off the transistor 69, the discharge time of the capacitor 67 may be elongated. Thus, the discharge time of the capacitor 67 may be adjusted by switching the transistor 69.

Figure 6:
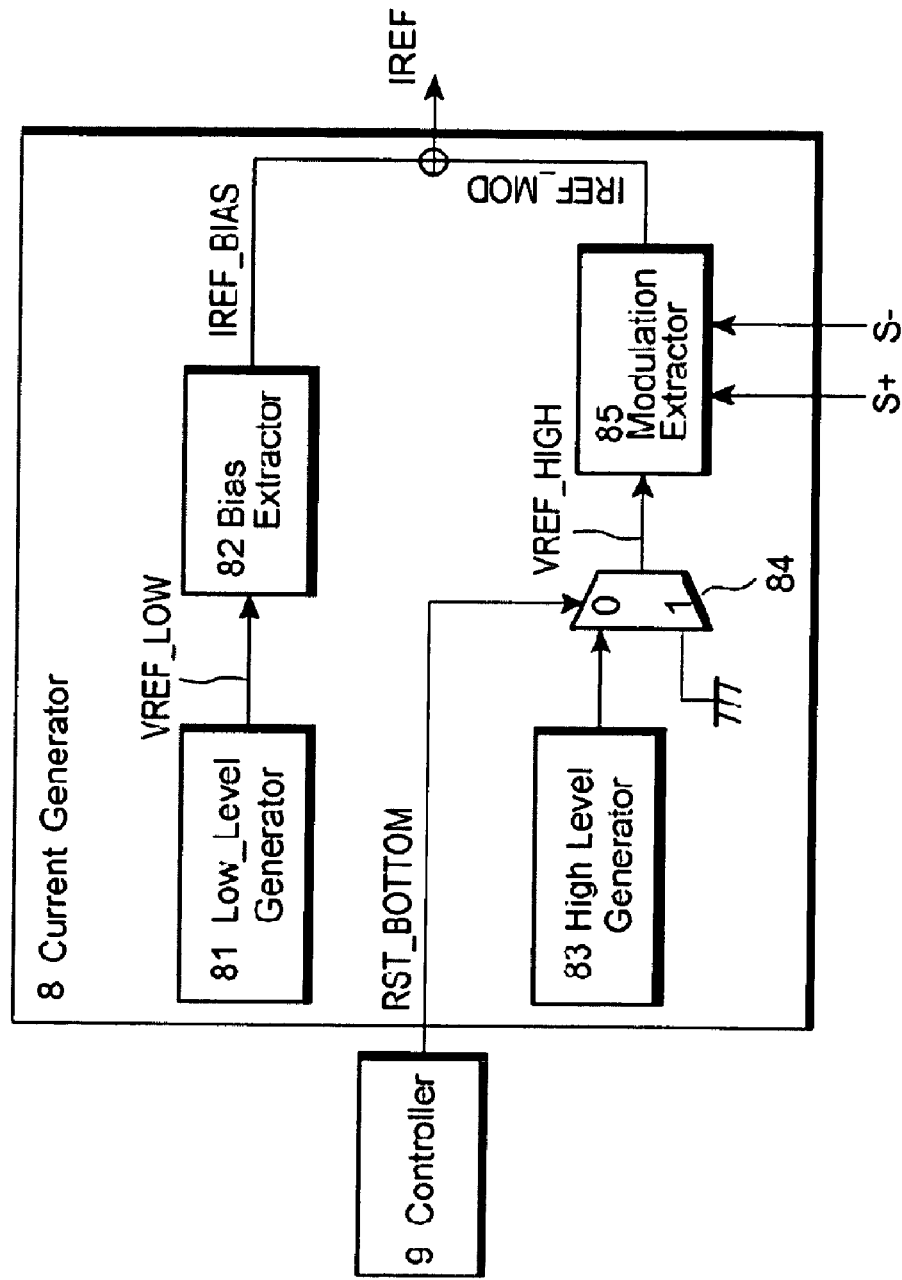
FIG. 6 shows an example of the reference generator.

FIG. 6 is a block diagram of the current generator 8. The current generator 8 includes a low level generator 81, a bias extractor 82, a high level generator 83, a switch 84, and a modulation extractor 85.

The low level generator 81 generates a reference VREF_LOW that corresponds to the LOW level of the reference current IREF. The reference VREF_LOW may be determined in advance. The bias extractor 82 converts the reference VREF_ LOW output from the low level generator 81 into a current IREF_BIAS.

The high level generator 83 generates a reference VREF_HIGH that corresponds to the HIGH level of the reference current IREF. The reference VREF_HIGH may be also determined in advance. The modulation extractor 85 converts the reference VREF_HIGH into a current and modulates this current with the external signals, S+ and S−. The modulation extractor 85 outputs thus converted and modulated current as a modulation component IREF_MOD of the reference current IREF. The reference current IREF that merges the outputs IREF_BIAS of the bias extractor 82 and that IREF_MOD of the modulation extractor 85 is output from the current generator 8 to the second I/V-C 5b.

The modulation extractor 85 is coupled with the high level generator 83 via the switch 84. The switch 84 turns on to transmit the output of the high level generator 83 to the modulation extractor 85 when the control signal RST_BOTTOM is in the LOW level. While, the switch becomes turns off and provides the ground to the modulation extractor when the control signal RST_BOTTOM is in the HIGH level. That is, when the control signal RST_BOTTON is in the HIGH level, the modulation component of the reference current is not generated and only the bias component of the reference current IREF is output from the current generator 8. On the other hand, when the control signal RST_BOTTOM is in the LOW level, the reference current IREF that contains both the modulation component and the bias component is output from the current generator 8.

Next, a sequence of the LD driver 1 when the transmission of the optical signal begins will be described as referring to FIGS. from 7 to 9. FIGS. from 7A to 7E show time charts of the output VREF_LOW of the low level generator 81, the output VREF_HIGH of the high level generator 83, the reference VREF, the output REF_PEAK of the peak hold 61b, and the output REF_BOTTOM of the bottom 62b, respectively. FIGS. from 8A to 8D show time charts of the control signals, LDOFF, RST_PEAK, RST_BOTTOM and SEL, respectively. Moreover, FIGS. from 9A to 9D show time charts of the output VMON of the first I/V-C 5a, the output MON_PEAK of the peak hold 61a, the output MON_BOTTOM of the bottom hold 62a, and the driving current ID, respectively.

Figure 7A:
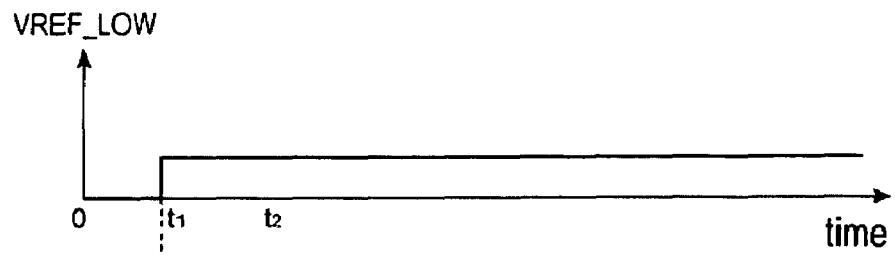
Figure 7B:
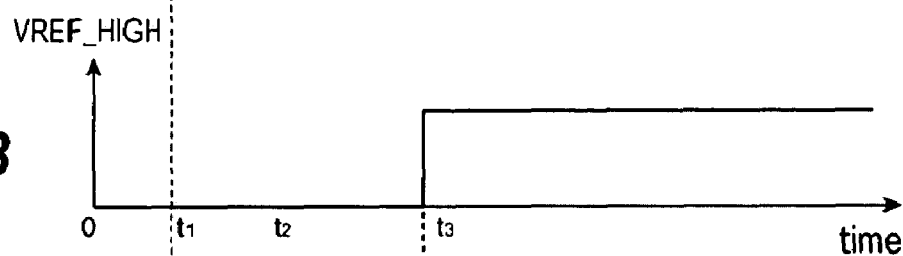
Figure 7C:
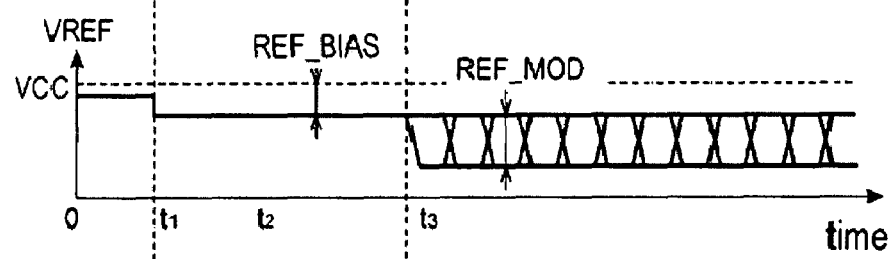
Figure 7D:
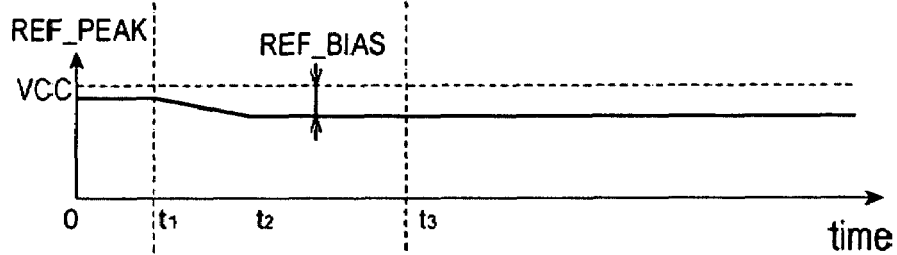
Figure 7E:
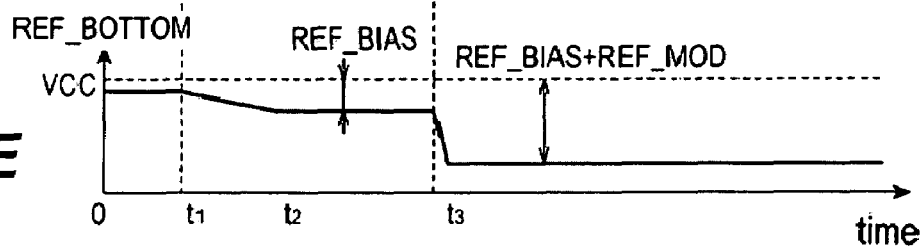
Figure 8A:
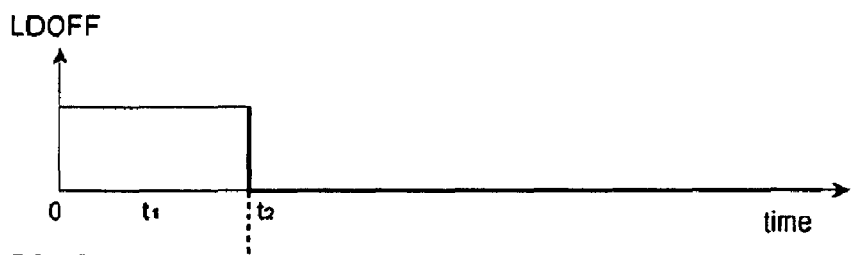
Figure 8B:

First, the output VREF_LOW of the low level generator 81 is set at t1 (FIG. 7A). Then, the control signal RST_BOTTOM from the controller 9 is set HIGH, as shown in FIG. 8B, to disconnect the switch 84, accordingly, only the current IREF_BIAS is output from the current generator 8 as the reference current IREF. The reference generator 13 generates only the reference REF_BIAS as the bias component, as shown in FIG. 7C. In the present embodiment, the I/V-C 5b reverses the phase between the input and the output thereof, accordingly, the reference VREF becomes a level decreased by REF_BIAS from the power supply VCC. Moreover, since the reference VREF excludes the modulation component, two references, REF_PEAK and REF_BOTTOM, are set in the same level REF_BIAS, as shown in FIGS. from 7D and 7E.

Figure 9A:
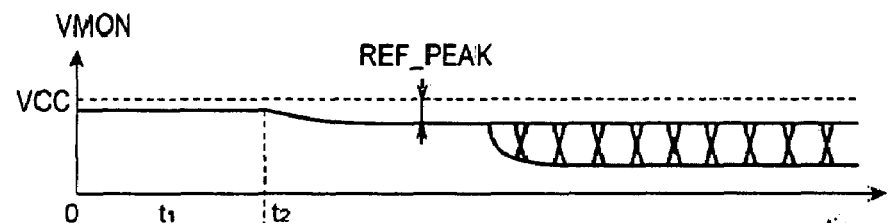
Figure 9B:
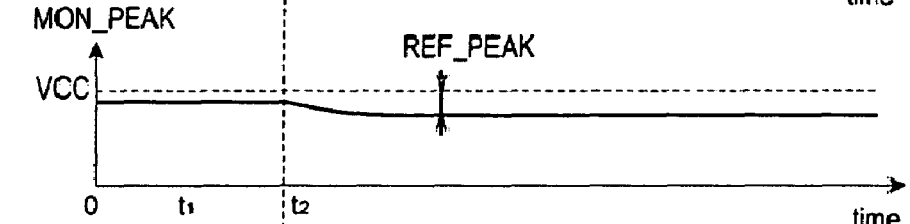
Figure 9C:
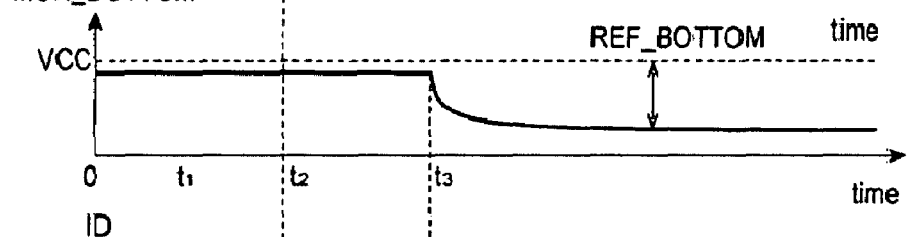
Figure 9D:
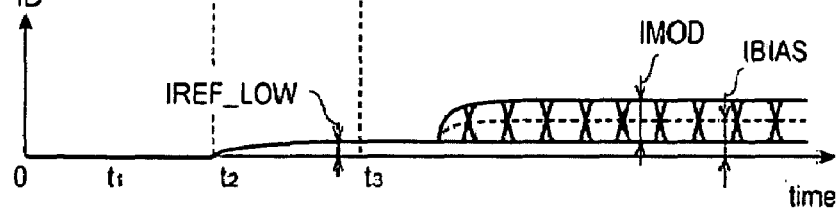

Subsequently, the control signal LDOFF and RST_PEAK are changed to the LOW level at t2, FIG. 8A and FIG. 8B. That is, in switches, 10a, 10c, 10e, and 10f, the input and the output thereof are connected to provide the reference REF_PEAK to the first error amplifier 7a, and the output ERROR_PEAK of the error amplifier 7a is conducted to the bias driver 4 to constitute the feedback loop for the bias current IBIAS, which begins the bias current to supply to the LD 21 and the feedback loop operates such that two inputs, MON_ PEAK and REF_PEAK, of the first error amplifier 7a becomes substantially equal to each other, that is, the bias current IBIAS becomes equal to the reference IREF_LOW, as shown in FIG. 9D.

Figure 8C:
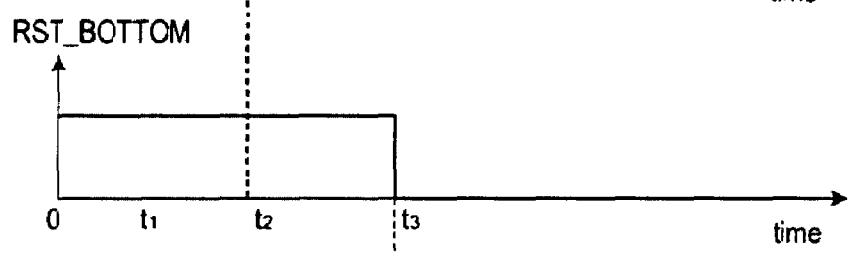

Next, the controller 9 switches the signal RST_BOTTOM to the LOW level at t3, as shown in FIG. 8C. That is, switches 10b, 10d, and 84 shown in FIG. 6 are each connected between the input and the output thereof.

Then, the current generator 8 outputs not only the bias component IREF_LOW but also the modulation component IREF_MOD as the reference current IREF. Accordingly, the Reference generator 13 generates both components, REF_BIAS and REF_MOD, as shown in FIG. 7C. That is, the bottom level of the reference VREF becomes a sum of two components, REF_MOD and REF_BIAS.

Moreover, the bottom level of the reference REF_BOTTOM, which is formed by tracing the bottom level of the reference VREF by the bottom hold 62b, is conducted to the second error amplifier 7b, and the output ERROR_BOTTOM of the error amplifier 7b is conducted to the modulation driver 3 to form the closed feedback loop for the modulation current IMOD. Thus, the feedback loop for the modulation current operates such that two inputs, MON_BOTTOM and REF_BOTTOM, of the error amplifier 7b becomes substantially equal to each other, which adjust the modulation current IMOD to the reference current IREF_MOD.

Figure 8D:
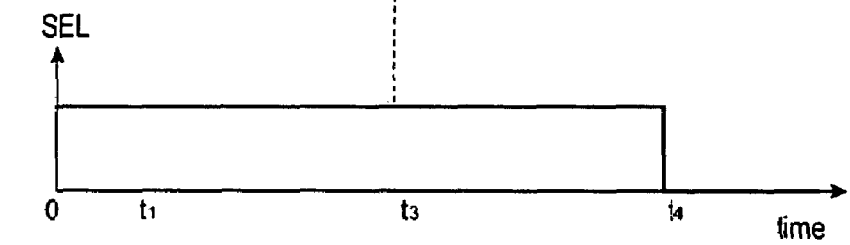

Then, the controller 9 changes the signal SEL to the LOW level at t4, FIG. 8D. That is, transistors, 65 and 69, in respective peak holds, 61a and 61b, and two bottom holds, 62a and 62b, are turned off to increase the time constant of respective hold circuits, 61a, 61b, 62a, and 62b.

In the conventional driver circuit with the switching transistor connected in series to the LD and operating in the DC mode, the bias current IBIAS maybe adjusted based on the LOW level of the optical signal, while, the modulation current IMOD may be adjusted based on the HIGH level of the optical output from the LD independent of the control of the bias current IBIAS. However, in the driver coupled with the LD via the coupling capacitor, to change the modulation current IMOD varies both the LOW and HIGH levels of the optical signal.

To solve this subject, the controller 9 adjusts the start of the closed loop, that is, the modulation driver 3 provides the modulation current IMOD with a preset delay after the start of the feeding of the bias current IBIAS. When the modulation current IMOD is not provided for a preset period after the supplement of the bias current IBIAS by the bias driver 4, the LOW level of the optical signal may be independently adjusted during such period because the feedback loop for the HIGH level of the optical signal does not operate. After adjusting and stabilizing the LOW level of the optical signal, the HIGH level thereof may be adjusted and stabilized by supplying the modulation current IMOD by the modulation driver 3. Thus, according to the present embodiment, the output power and the extinction ratio of the optical signal may be stably controlled even when the LD is coupled with the driver via the coupling capacitor, namely, coupled in the AC mode.

The LD driver 1 of the present invention has an advantage, in particular, in a case where the capacitor in the peak holds, 61a and 61b, are discharged, while, the capacitor in the bottom holds, 62a and 62b, are charged at the beginning of the operation. In such case, because the time constant of the charge is smaller than that of the discharge, that is, the capacitor is slowly discharged, it takes time to stabilize the closed loop including peak holds, 61a and 61b, to stabilize the bias current IBIAS. When the other closed loop to stabilize the modulation current IMOD causes the interference in the closed loop for the bias current IBIAS, it takes further time to stabilize the latter loop, the feedback loop for the bias current IBIAS. According to the present LD driver 1, because the closed loop including the peak holds, 61a and 61b, for the bias current IBIAS is stabilized prior to the starting of the other feedback loop, the interference between the closed loops for the bias current IBIAS and for the modulation current IMOD may be prevented, thereby prompting the stabilization of the loops.

Moreover, as shown in FIG. 5, the peak hold 61a provides the circuit with the resistor 64 and the transistor 65, where they are connected in parallel to the capacitor and each connected in series to each other, and the transistor 65 may be turned off after the stabilization of the modulation current IMOD. Moreover, the bottom hold 62a also provides the circuit with the resistor 68 and the transistor 69, connected in parallel to the capacitor 57, and the transistor 69 may be turned off after the modulation current IMOD is stabilized. Accordingly, the performance against the noise with high frequency components may be enhanced by increasing the time constant of the peak hold 61a and the bottom hold 62a after the stabilization of the power and the extinction ratio of the optical signal.

Second Embodiment

FIG. 10 is a block diagram of the LD driver 1a according to the second embodiment of the invention. The LD driver 1a has a feature that, in addition to the former LD driver 1 shown in FIG. 1, the reference current IREF output from the current generator 8 is provided to the second I/V-C 5b via the variable capacitor 15.

The variable capacitor 15 varies the capacitance thereof by the control signals, BW_SEL1 to BW_SEL3, from the controller 9 and reflects the influence of the junction capacitor of the PD 22 and the de-coupling capacitor to be coupled in parallel to the PD 22 in the reference signal VREF. That is, the junction capacitance of the PD 22 and the input impedance of the first I/V-C 5a form a low-pass filter that affects the frequency characteristic of the monitored signal VMON. By interposing the variable capacitor 15 between the current generator 8 and the second I/V-C 5b, the variable capacitor 15 and the input impedance of the I/V-C 5b also forms the LPF to cause the frequency response to the reference signal VREF similar to that for the monitored signal VMON.

FIG. 11 is a circuit diagram of the variable capacitor 15. An example of the modulation extractor 85 within the current generator 8 and the second I/V-C 5b are appeared in FIG. 11. The variable capacitor 15 includes m pieces of capacitors, 91a to 91c, where m is equal to 3 in FIG. 11, are configured in the embodiment shown in FIG. 11, and m pieces of transistors, 92a to 92c, each connected in series to respective capacitors, 91a to 91c. The gates of the transistors, 92a to 92c, each receives one of control signals, BW_ADJ1 to BW_ADJ3, output from the controller 9, and is switched between the turn-on state and the turn-off state, whereby the total capacitance of the variable capacitor 15 may be varied.

The modulation extractor 85 includes a transistor 86 configured in the common base mode, a pair of transistors, 87a and 87b, and the current source 88. The pair of transistors, 87a and 87b, couples with the external signals, S+ and S−, in the base and is connected to the current source 88 in the common emitter thereof. The transistor 87a is connected in cascade to the transistor 86, while, the other transistor 87b is coupled with the I/V-C 5b via the signal line 18. The current source 88 sets the current by the signal VREF_HIGH output from the high level generator 83 in FIG. 6. For the transistor 86, the collector is connected to the power supply VCC 14, while, the base receives the bias voltage VCB. This transistor 86 is the counterpart of the transistor 51 within the I/V-C 5b operated in the common base configuration.

In the present embodiment, because the reference section 13 includes the current generator 8 and the second I/V-C 5b and this I/V-C 5b configures, similar to the first I/V-C 5a, with the transistor operated in the common base mode, even when the conversion gain of the first I/V-C 5a fluctuates due to the temperature change, the second I/V-C 5b may compensate the fluctuation in the conversion gain. Moreover, because the variable capacitor 15 is interposed between the current generator 8 and the I/V-C 5b, the same frequency response may be reflected on the reference signal VREF with the monitored signal VMON that is affected by the junction capacitance of the PD 22, and the frequency response appeared in the reference signal VREF may be adjusted by the signals, BW_ADJ1 to BW_ADJ3, which may compensate the scattering of the junction capacitance for individual PDs.

Third Embodiment

FIG. 12 is a block diagram of the LD driver 1b according to the third embodiment of the invention. The LD driver 1b includes a modulation driver 103, a bias driver 104, an I/V-C 105, an average detector 106, a first reference generator 107, two LPFs, 109 and 113, two error amplifiers, 108 and 111, two amplitude detectors, 110 and 114, a second reference generator 112, and a controller 130.

The modulation driver 103 and the bias driver 104 are coupled with the cathode of the LD 21 via the coupling capacitor 102 and the inductor 101, respectively. The anode of the LD 21 couples with the power supply VCC 14.

The photocurrent IMON generated in the PD 22 enters the I/V-C 105 to be converted into the voltage signal VMON. The configuration of the I/V-C 105 is the same with those shown in FIG. 4 that includes the transistor operated in the common base mode. The signal VMON enters the average detector 106 to detect the average thereof. The average MON_AVE of the signal VMON, which is equivalent to the average of the photocurrent IMON, is compared by the error amplifier 108 to the reference output from the reference generator 107. The error amplifier 108 generates the output ERROR_AVE such that two inputs, the signal MON_AVE and the reference output from the reference generator 107, becomes substantially equal to each other. The bias driver 104, by receiving this control signal ERROR_AVE, controls the bias current to adjust the average output power from the LD 21.

The output VMON of the I/V-C 105 is further led to the amplitude detector 110 via the LPF 109. The cut-off frequency of the LPF 109 is set in a value almost equal to, or slightly smaller than a transmission speed of the external signal SIN to eliminate noises with high frequency components. Thus, the signal corresponding to the amplitude of the optical signal, which is equivalent to the extinction ratio, is extracted and detected in the amplitude thereof by the first amplitude detector 110.

On the other hand, the second reference generator 112 generates a reference signal VREF modulated by the external signal SIN. The reference signal VREF is filtered by the LPF 113, which has the cut-off frequency substantially same as that of the first LPF 109, and is extracted in the amplitude thereof by the second amplitude detector 114. The outputs, MON_AVE and MON_AMP, from two amplitude detectors, 110 and 114, are led to the second error amplifier 111 and compared thereby. The second error amplifier 111 generates the output ERROR_AMP such that two inputs thereof become substantially equal to each other. The modulation driver 103 controls the modulation current IMOD by receiving the output ERROR_AMP.

The LD driver 1b according to the present embodiment, the I/V-C 105 includes the transistor operated in the common base mode, similar to the prior embodiments, accordingly, the conversion gain thereof may be varied without affecting the frequency response thereof. Thus, the configuration above makes it easy to compensate the frequency response when the conversion gain is necessary to be varied depending on the performance of the individual LDs.

Moreover, the LD driver 1b of the present embodiment interposes the LPF 109 between the I/V-C 105 and the amplitude detector 110. This LPF 109 restricts the frequency bandwidth of the monitored signal VMON output from the I/V-C 105, which reduces the crosstalk noise inherently appeared in the monitored signal VMON. The crosstalk noise primarily occurs at the leading or falling edges of the modulation current. Because the LPF 109 reduces the crosstalk noise, the amplitude detector 110 may accurately detects the amplitude of the monitored signal VMON.

In the first and second embodiments, each shown in FIG. 1 or FIG. 10, the bias current IBIAS and the modulation current IMON are controlled by detecting and comparing the peak and bottom values in both the signal monitoring path and the reference generating path. In the present embodiment, the average and the amplitude are extracted in both of paths and compared to each other to control the driving current of the LD. Thus, in the driving of the LD according to the present invention, it is not restricted to the bottom and peak values to control the driving current, while, it may be applicable to extract the average and the amplitude and to compare these values between the monitored signal and the reference signal.

The former embodiment shown in FIG. 12 fixes the cut-off frequency of the LPFs, 109 and 113, but it may be applicable to vary the cut-off frequency of the LPFs, 109 and 113. Moreover, it is preferable to vary the cut-off frequency depending on the transmission speed of the external signal SIN. The transmission speed may be detected by installing an additional circuit within the LD driver 1b or may be provided from the outside of the driver 1b. By setting the cut-off frequency of the LPFs, 109 and 113, slightly smaller than the transmission speed, the accuracy of the extraction of the amplitude by the amplitude detector, 110 and 114, may be enhanced.

Fourth Embodiment

FIG. 13 is a block diagram of the LD driver 1c according to the fourth embodiment of the invention. The LD driver 1c modifies the LD driver 1b already explained as referring to FIG. 12, and is configured to convert the photocurrent IMON generated in the PD 22 into the monitored signal VMON, to pass thus converted monitored signal VMON in the LPF 109 to eliminate noise with higher frequency components, and to extract the average MON_AMP and the amplitude MON_AVE of the monitored signal by the average detector 106 and the amplitude detector 110, respectively.

On the other hand, the reference signal is configured to generate the reference current IREF modulated with the external signal SIN by the current generator 121, to convert this reference current IREF into the voltage signal VREF by the I/V-C 122, to pass this signal VREF through the LPF 113 to eliminate noises with high frequency components, and to extract the average REF_AVE and the amplitude REF_AMP by the average detector 117 and the amplitude detector 114, respectively. The first and second error amplifiers, 108 and 111, compares thus generated signals corresponding to the average, MON_AVE and REF_AVE, and the signals corresponding to the amplitude, MON_AMP and REF_AMP, to generate the outputs, ERROR_AVE and ERROR_AMP, respectively. These outputs, ERROR_AVE and ERROR_AMP, are fed back to the bias driver 104 and the modulation driver 103, respectively to control the bias current IBIAS and the modulation current IMOD.

Moreover, the LD driver 1c provides the variable capacitor 123 between the current generator 121 and the second I/V-C 122. The variable capacitor simulates the junction capacitance of the PD 22 and the input capacitance of the first I/V-C 105, and makes it equivalent for the frequency response in the monitoring path and that in the reference path, which enhances the accuracy of the comparison between the monitored signal and the reference signal.

In the present embodiment, similar to the prior examples, the controller 130 outputs the signal SEL to operate the feedback loop including the first error amplifier to stabilize the bias current first, and subsequently operates the other feedback loop including the second error amplifier to stabilize the modulation current IMON by a predetermined delay to the operation of the first feedback loop. Accordingly, even when the LD driver 1c couples with the LD 22 in the AC mode via the coupling capacitor, the bias current IBIAS and the modulation current IMOD for the LD may be independently and stably determined.

In the foregoing detailed description, the present invention has been described with reference to specific exemplary embodiments thereof. It will, however, be evident that various modifications and changes may be made thereto without departing from the broader spirit and scope of the present invention. For instance, the embodiments have concentrated in the coupling between the driver and the LD with the AC mode via the capacitor. However, the present invention may be applicable to the coupling with DC mode. The present specification and figures are accordingly to be regarded as illustrative rather than restrictive.

What is claimed is:

1. A driving circuit for a semiconductor laser diode for controlling an output power and an extinction ratio of light emitted from the laser diode by supplying a modulation current and a bias current responding to an external signal, the driving circuit comprising:
   a first current-to-voltage converter for converting a photocurrent output from a photodiode that monitors the light emitted from the laser diode into a monitored signal;
   a current generator for outputting a reference current generated by superposing a reference bias current on a reference modulation current modulated by the external signal;
   a second current-to-voltage converter for converting the reference current into a reference signal;
   a first error amplifier configured to compare a first level of the monitored signal with a first reference level of the reference signal and to output a first error signal;
   a second error amplifier configured to compare a second level of the monitored signal with a second reference level of the reference signal and to output a second error signal;
   a bias driver for controlling the bias current by receiving the first error signal;
   a modulation driver for controlling the modulation current by receiving the second error signal; and
   a variable capacitor provided between the current generator and the second current-to-voltage converter,
   wherein the first error amplifier outputs the first error signal so as to equalize the first level of the monitored signal to the first level of the reference signal, and the second error amplifier outputs the second error signal so as to equalize the second level of the monitored signal to the second level of the reference signal,
   wherein the variable capacitor compensates for a junction capacitance of the photodiode.

2. The driving circuit according to claim 1,
   wherein the first and second current-to-voltage converters each includes a transistor operated in a common base mode.

3. The driving circuit according to claim 1,
   wherein the first level and the first reference level are a peak level of the monitored signal and a peak level of the reference signal, respectively, and
   wherein the second level and the second reference level are a bottom level of the monitored signal and a bottom level of the reference signal, respectively.

4. The driving circuit according to claim 1,
   wherein the first level and the first reference level are an average of the monitored signal and an average of the reference signal, respectively, and
   wherein the second level and the second reference level are an amplitude of the monitored signal and an amplitude of the reference signal, respectively.

5. The driving circuit according to claim 1,
   wherein the modulation driver supplies the modulation current to the laser diode in the AC mode.

6. The driving circuit according to claim 5,
   wherein the modulation driver outputs the modulation current from two output ports in a differential mode, and
   wherein the laser diode is coupled between two output ports via capacitors.

7. A method for driving a semiconductor laser diode by supplying a bias current and a modulation current, the modulation current responding to an external signal, the method comprising steps of:
   (a) creating a reference signal based on a reference bias current superposed with a reference modulation current, the reference modulation current being modulated by the external signal;
   (b) creating a monitored signal by detecting an emission of the laser diode;
   (c) determining first level and second level of the monitored signal;
   (d) controlling the bias current by comparing the first level of the monitored signal with a first reference level of the reference signal so as to minimize a difference between the first level and the first reference level; and
   (e) controlling the modulation current by comparing a second level of the monitored signal with a second reference level of the reference signal so as to minimize a difference between the second level and the second reference level,
   wherein the step (e) starts with a predetermined delay after the bias current becomes stable by the step (d).

8. The method according to claim 7,
   wherein the step (d) controls the bias current by comparing a peak level of the monitored signal as the first level with a peak level of the reference signal as the first reference level, and
   wherein the step (e) controls the modulation current by comparing a bottom level of the monitored signal as the second level with a bottom level of the reference signal as the second reference level.

9. The method according to claim 7,
   wherein the step (d) controls the bias current by comparing an average of the monitored signal as the first level with an average of the reference signal as the first reference level, and
   wherein the step (e) controls the modulation current by comparing an amplitude of the monitored signal as the second level with an amplitude of the reference signal as the second reference level.

10. A method for driving a semiconductor laser diode by supplying a bias current and a modulation current, the modulation current responding to an external signal, the method comprising steps of:
   (a) creating a reference signal by steps of,
      generating a reference current by superposing a reference bias current with a reference modulation current, the reference modulation current being modulated by the external signal;
      affecting the reference current by a variable capacitor, and
      converting the reference current into the reference signal;
   (b) creating a monitored signal by a photodiode, having a junction capacitance, based on emission of the laser diode;
   (c) controlling the bias current by comparing a first level of the monitored signal with a first level of the reference signal so as to minimize a difference between the first level of the monitored signal and the first level of the reference signal; and (d) controlling the modulation current by comparing the second level of the monitored signal with a second level of the reference signal so as to minimize a difference between the second level of the monitored signal and the second level of the reference signal, wherein the variable capacitor compensates for the junction capacitance of the photodiode.

11. The method according to claim 10, wherein the first level of the monitored signal and the first level of the reference signal are a peak level of the monitored signal and a peak level of the reference signal, respectively, and wherein the second level of the monitored signal and the first level of the reference signal are a bottom level of the monitored signal and a bottom level of the reference signal, respectively.

12. The method according to claim 10, wherein the first level of the monitored signal and the first level of the reference signal are an average of the monitored signal and an average of the reference signal, respectively, and wherein the second level of the monitored signal and the second level of the reference signal are an amplitude of the monitored signal and an amplitude of the reference signal, respectively.

13. The method according to claim 10, wherein the step (b) includes steps of, (b1) generating a photocurrent by monitoring the emission of the laser diode by the photodiode, and (b2) converting the photocurrent into the monitored signal by a first current-to-voltage converter.

14. The method according to claim 10, wherein the variable capacitor is connected between an input port of the second current-to-voltage converter and the ground.

* * * * *